United States Patent [19]

Ezzeddine

[11] Patent Number: 4,929,855

[45] Date of Patent: May 29, 1990

[54] HIGH FREQUENCY SWITCHING DEVICE

[75] Inventor: Amin K. Ezzeddine, Plainsboro, N.J.

[73] Assignee: Grumman Corporation, Bethpage, N.Y.

[21] Appl. No.: 281,764

[22] Filed: Dec. 9, 1988

[51] Int. Cl.[5] .............................................. H03K 17/60
[52] U.S. Cl. ................................... 307/571; 307/570; 333/104; 333/262
[58] Field of Search .............. 307/571, 570, 254, 270; 330/269, 277, 296; 333/103, 104, 262

[56] References Cited

U.S. PATENT DOCUMENTS

| | | | | |
|---|---|---|---|---|
| 3,269,776 | 8/1966 | Reed | ...................................... | 307/254 |
| 3,496,385 | 2/1970 | Hopkins | ............................... | 307/254 |
| 3,622,899 | 11/1971 | Eisenberg | ............................ | 330/263 |
| 4,070,589 | 1/1978 | Martinkovic | ....................... | 307/246 |
| 4,367,421 | 1/1983 | Baker | ..................................... | 307/571 |
| 4,677,391 | 6/1987 | Kawakami | .......................... | 330/269 |
| 4,751,408 | 6/1988 | Rambert | .............................. | 307/571 |

Primary Examiner—Stanley D. Miller
Assistant Examiner—Terry Cunningham
Attorney, Agent, or Firm—Bacon & Thomas

[57] ABSTRACT

A high frequency switch includes at least two transistors connected in series. By connecting the transistors in series the power handling capability can be increased by a factor of $N^2$, where N is the number of transistors connected in series. The series is isolated by high impedance resistors and the transistors may be gallium arsenide field-effect transistors.

10 Claims, 1 Drawing Sheet

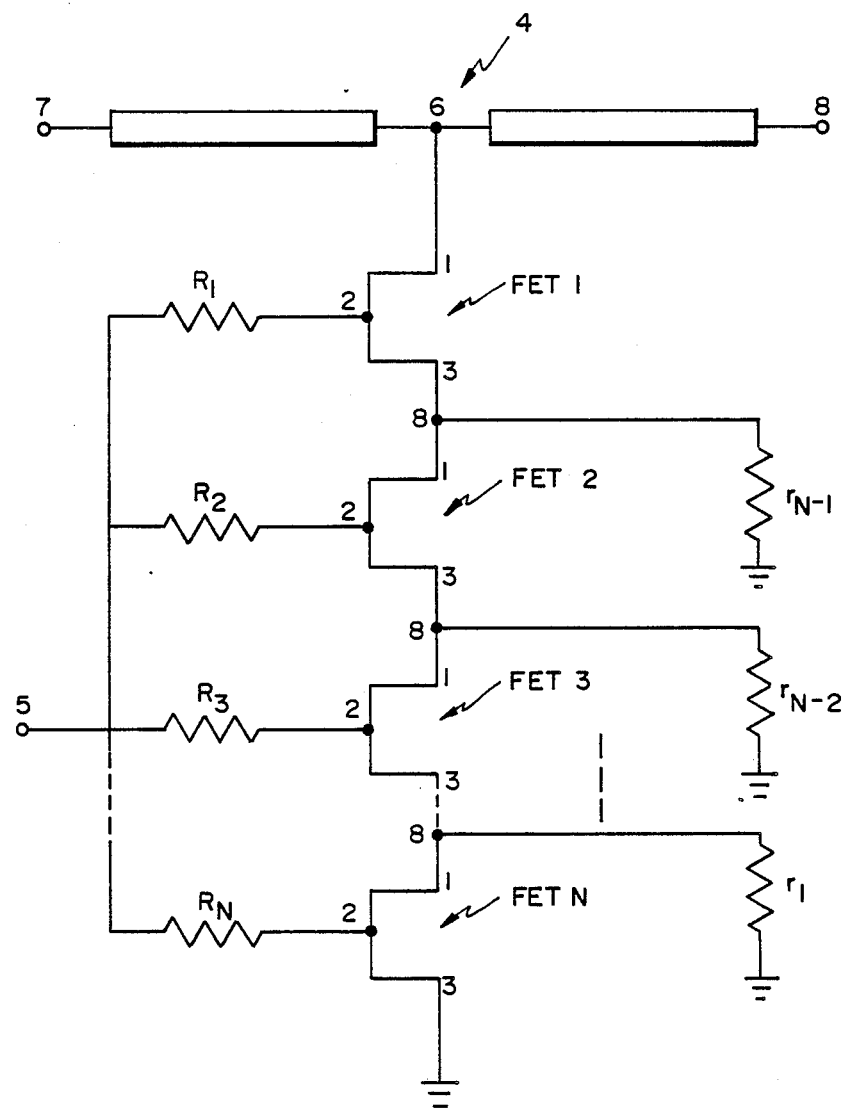

HIGH FREQUENCY SWITCHING DEVICE

BACKGROUND OF THE INVENTION

1. Field of the Invention

This invention relates to a high frequency switching device having an increased power handling capacity.

2. Description of the Related Art

A variety of semi-conductor devices are known to be suitable for use in radio frequency and microwave switching applications. These include PIN diodes, silicon bi-polar RF and microwave transistors, and field-effect transistors (FETs), all of which share the property of bias-voltage dependent impedances at high frequencies. Gallium arsenide (GaAs) FETs, especially, are advantageous for many RF and microwave switching applications because of their relatively high gate-source and gate-drain isolation, which permits use down to DC. When used in RF switches, GaAs FETs also have the advantage of small bias-line to RF port video frequency breakthrough, and they contribute very little noise.

Conventional RF and microwave transistor-based switches are limited, however, by their power handling capabilities. For example, present technology can provide FET junctions with a 20 volt peak breakdown voltage, which means that in a typical configuration having input and output port impedances of 50 ohms, the power handling capacity of the FETs will be limited to 4 watts. The present invention solves the power handling limitations of the conventional RF and microwave transistor-based switches.

BRIEF SUMMARY OF THE INVENTION

It is an object of the invention to provide a radio frequency or microwave switch having an increased-power handling capability.

It is another object of the invention to provide a radio frequency or microwave switch which uses gallium arsenide field-effect transistors arranged to increase power handling capability.

It is a further object of the invention to provide an increased-power radio frequency switch connected in shunt with a transmission line.

These objects are achieved by connecting at least two radio frequency or microwave transistors in series between a high frequency signal source and a fixed reference potential, by making the impedances of the control electrode bias high compared to the impedances of the transistors, and by placing high impedances between series connections of the transistors and the reference potential. In the case of a transmission line shunt-power switch, the reference potential may be a ground potential, and the high impedances are achieved by connecting resistors between the bias source and each of the control electrodes, and between the series connections and ground. By connecting at least two transistors in this manner, the power handling capability can be increased by a factor of $N^2$, where N is the number of transistors connected in series.

BRIEF DESCRIPTION OF THE DRAWING

The drawing shows a circuit diagram for the transmission line shunt-power switch in accordance with the preferred embodiment of the invention.

DETAILED DESCRIPTION OF THE PREFERRED EMBODIMENT

As shown in the drawing, a representative high frequency switch includes N transistors FET1, FET2, FET3, ... FETN connected in series. In the preferred embodiment the transistors are gallium arsenide field-effect transistors (FETs), but it will readily be recognized by one skilled in the art that other high frequency transistors could also be connected in the same manner.

Each of the field-effect transistors FET1 to FETN has a control electrode 2, and two other electrodes 1 and 3. In the case of FETs, the control electrodes 2 are gates, and electrodes 1 may be either drains or sources, depending on whether the FETs are P-channel FETs or N-channel FETs. If electrodes 1 are drains, then electrode 3 will be sources, and vice versa.

The electrode 1 of FET1 is connected at node or point 6 to radio frequency transmission line 4 which includes input 7 and output 8, and electrode 1 of each of the other FETs is connected to the other electrode 2 of the proceeding FET in the series, forming series connections 8 between the FETs. The remaining electrode 2 is connected to a reference potential, which is ground in the preferred embodiment. When the FETs are "ON", the transmission line is shorted to ground.

When control electrodes 2 are biased by a suitable voltage, which is inputted at terminal 5, the FETs will turn "OFF", whereupon the impedances of the FETs will decrease and a path will form between point 6 and ground. The path extends through each of the electrodes 1 and 3 and through the channels formed therebetween. The FETs essentially behave, when turned "OFF", like capacitors, and therefore the internal impedances of the FETs are further dependant on the frequency of the electric signal at point 6, i.e, the impedances are inversely proportional to frequency, as is well known. Therefore, the FETs will only pass high frequency components of the electric signal.

In order to ensure that the electric signal flows to ground via the above-described path, it is necessary that the FETs be isolated by high impedances at the gates 2 and at the series connections 8. These impedances must be substantially higher than the internal impedances of the FETs in order to prevent short circuits through the gates 2 and shorts to ground at any of the series connections 8. Furthermore, it is advantageous that the impedances be high at all frequencies, which means that resistors should be included. In the preferred embodiment, respective resistors $R_1$ to $R_N$ are connected to each of the gates 3, and respective resistors $r_{N-1}$ to $r_1$ are connected between each of the series connections 8 and the ground or reference potential to allow proper charging of the FET junctions.

Because the power handling capability of the switch described above is limited by the breakdown voltages of each of the N transistors rather than by the breakdown voltage of one transistor, it follows that the power handling capability for N transistors will be increased by a factor $N^2$ over that of a single transistor. This is because the peak voltage is distributed among the N transistors, permitting the voltage at point 6 to be increased by a factor of N, and the power by $N^2$. For example, present technology can provide FET junctions having a 20 volt breakdown. In the case of a typical 50 ohm transmission line with a single shunt FET, the maximum power on the line which can be handled by the switch is the square of the RMS breakdown causing voltage, divided by the impedance at point 6, or 4 watts. By providing at least two FETs in series, the power handling capability can easily reach 16 watts for two FETs, 64 watts for four FETs, and so forth, resulting in switches which can handle orders of magnitude higher power than conventional switches.

Of course, it will be noted that the concept of connecting transistors in series to increase the power handling capability of a high frequency switch is not limited to a particular type of transistor. The invention is also applicable to bi-polar transistors, and other transistors such as high-electron-mobility transistors, and gallium indium arsenide metal-insulator-semiconductor FETs. Furthermore, it is contemplated that terminal 5 may be connected to a switchable voltage source rather than to a constant DC voltage source, that transmission line 4 is replacable by a wide variety of signal sources, and that the invention will therefore be adaptable for use in any of the large number of communication or electronics applications requiring a high power, high frequency switch. Consequently, the foregoing detailed description should be considered exemplary in nature and not limiting to the scope and spirit of the invention set forth in the appended claims.

What is claimed is:

1. A high frequency switch comprising:
   at least two field-effect transistors, each including a control electrode and two other electrodes, connected to each other in series between a high frequency electric signal source and reference potential means for providing a reference potential, said two other electrodes of said at least two field effect transistors forming the series connection between said transistors;
   first means for biasing the control electrode of each of said transistors to cause components of an electric signal which exceed a threshold frequency to flow from said electric signal source to said reference potential means through a channel between said two other electrodes of each of said transistors, said first means having an impedance which is high compared to the internal impedances of said transistors; and
   second means connected between each junction of said series connection of said at least two transistors and said reference potential means for establishing an impedance between each junction of said series connection and said reference potential which is high compared to the internal impedances of said transistors.

2. The high frequency switch of claim 1, wherein said electric signal has a frequency which is at least radio frequency.

3. The high frequency switch of claim 1, wherein said field-effect transistors are gallium arsenide field-effect transistors.

4. The high frequency switch of claims 2, or 3, wherein said electric signal source is a radio frequency transmission line.

5. The high frequency switch of claims 2, or 3, wherein said reference potential is at ground potential.

6. The high frequency switch of claim 1, wherein said control electrodes are the gates of said field-effect transistors.

7. The high frequency switch of claim 1, wherein the number of said at least two transistors is equal to N, and said second means includes at least N−1 resistors.

8. The high frequency switch of claim 7, wherein said series connection comprises connections between drains and sources of the respective field-effect transistors.

9. The high frequency switch of claim 1, wherein the power handling capability of said switch increases by a factor $N^2$ when N is the number of said at least two transistors connected in series.

10. A high frequency switch comprising:
    at least two field-effect transistors, each including a control electrode and two other electrodes, connected to each other in series between a high frequency electric signal source and reference potential means for providing a reference potential, said two other electrodes of said at least two field effect transistors forming the series connection between said transistors;
    first means for biasing the control electrode of each of said transistors to cause components of an electric signal which exceed a threshold frequency to flow from said electric signal source to said reference potential means through a channel between said two other electrodes of each of said transistors, said first means including a bias voltage source and a plurality of resistors, each resistor connected in series between said bias voltage source and the control electrode of a respective one of said transistors, and wherein said first means have an impedance which is high compared to the internal impedances of said transistors; and
    second means connected between each junction of said series connection of said at least two transistors and said reference potential means for establishing an impedance between each junction of said series connection and said reference potential which is high compared to the internal impedances of said transistors.

* * * * *